United States Patent
Sadakata

(10) Patent No.: US 7,529,144 B2
(45) Date of Patent: May 5, 2009

(54) HIERARCHICAL SEMICONDUCTOR MEMORY DEVICE CAPABLE OF CARRYING OUT A DISTURB REFRESH TEST ON A MEMORY ARRAY BASIS

(75) Inventor: Hiroyuki Sadakata, Osaka (JP)

(73) Assignee: Panasonic Corporation, Osaka (JP)

( * ) Notice: Subject to any disclaimer, the term of this patent is extended or adjusted under 35 U.S.C. 154(b) by 286 days.

(21) Appl. No.: 11/724,213

(22) Filed: Mar. 15, 2007

(65) Prior Publication Data
US 2007/0217261 A1  Sep. 20, 2007

(30) Foreign Application Priority Data
Mar. 15, 2006  (JP)  .............................. 2006-070587

(51) Int. Cl.
*G11C 29/00* (2006.01)
(52) U.S. Cl. .................. 365/201; 365/230.03; 365/190; 365/195
(58) Field of Classification Search ............ 365/230.03, 365/190, 205, 195, 191, 201
See application file for complete search history.

(56) References Cited

U.S. PATENT DOCUMENTS

| 5,519,659 | A | 5/1996 | Tanida et al. | |
|---|---|---|---|---|
| 5,574,691 | A | 11/1996 | Tanida et al. | |
| 5,666,317 | A | 9/1997 | Tanida et al. | |
| 6,295,238 | B1 * | 9/2001 | Tanizaki et al. | 365/201 |
| 6,762,967 | B2 * | 7/2004 | Tanizaki et al. | 365/201 |

* cited by examiner

*Primary Examiner*—Andrew Q Tran
(74) *Attorney, Agent, or Firm*—McDermott Will & Emery LLP

(57) ABSTRACT

A semiconductor memory device of the present invention provides, in a memory having an hierarchical bit line structure, a test mode which causes all switches for selecting hierarchical bit lines and a main bit line in an activated memory array to be connected all the time. With this configuration, it is possible to perform a disturb refresh test on a memory cell arrays basis regardless of the hierarchical bit line structure. Possibility of an erroneous read-out, which may be caused by connecting each of the hierarchical bit lines to one another and a consequent increase in a bit line load capacity, may be prevented by providing a timing control such that the switches are connected after a normal mode operation.

4 Claims, 4 Drawing Sheets

HIERARCHICAL SEMICONDUCTOR MEMORY DEVICE CAPABLE OF CARRYING OUT A DISTURB REFRESH TEST ON A MEMORY ARRAY BASIS

BACKGROUND OF THE INVENTION

1. Field of the Invention

The present invention relates to a semiconductor memory device, more specifically relates to a semiconductor memory device having a test circuit for detecting leakage of a memory cell transistor in a dynamic random access memory (DRAM).

2. Description of the Background Art

As a conventional test for detecting leakage of a memory cell transistor of a semiconductor memory device, particularly of a DRAM (hereinafter referred to as a disturb refresh test), there has been, for example, a technique as described below.

First, High (or Low) data is written into all memory cells. After a write operation into all the memory cells, a given word line is activated, and then an electric charge of a memory cell is read out onto a bit line perpendicular to the activated word line. The read electric charge is amplified (a read/refresh operation) in a sense amplifier circuit, whereby electric potentials of the bit line and a complimentary bit line respectively become High or Low. The situation is retained only for a time period in which retention of data of the memory cell can be assured (hereinafter referred to as a refresh test period).

Under this situation, a memory cell capacitor connected to a non-selected word line retains High data, and with respect to such memory cell that is connected to a bit line having a Low level, an electric potential difference will be generated between a drain and a source of the memory cell transistor, whereby a subthreshold current is passed through. Here, in the case of a memory cell having a transistor whose threshold voltage is low, a large amount of the subthreshold current passes through, and consequently data cannot be retained within a refresh test time period, and a defective cell will be generated. Therefore, after completion of the refresh test time period, the read operation is performed with respect to a test target memory cell so as to check whether or not data is accurately read out.

However, the electric potentials of the bit line and the complimentary bit line can be set High or Low, with regard to the memory cell connected to the non-selected word line, only on the basis of a memory cell array which includes a group of memory cells and a sense amplifier circuit. Further, the above-described refresh test time period usually tends to be set on the order of several ms or several tens of ms, which is substantially long compared to time periods of read-out and write of data from and into a memory, and thus the disturb refresh test constitutes a large proportion of a total test period of the memory.

To solve such problem, a method for reducing the time period of the above-described disturb refresh test has been adopted based on a method for activating a plurality of word lines simultaneously in accordance with a test mode, or on a simultaneous selection of a plurality of memory cell arrays (see, for example, U.S. Pat. Nos. 5,666,317, 5,574,691, 5,519,659 specification).

Along with process refinement and speedup in recent years, a unit of the memory cell array is scaled down, and as a result, the number of the memory cell arrays are increased. Further, in order to realize a large memory capacity with a small chip area, a memory having a hierarchical bit line structure, for example, a DRAM, has been introduced. In such memory, a plurality of sub-bit line pairs are provided so as to correspond to one main bit line pair, and each of the sub-bit line pairs is connected to the main bit line pair via two selection transistors.

However, in the memory having the above-described hierarchical bit line structure, in the case where a unit of the hierarchical bit line is set as a sub-memory cell array, a sub-bit line in a non-selected sub-memory cell array is electrically separated from a main bit line, even in a common memory cell array. Therefore a sufficient electric potential difference cannot be applied between the source and the drain of the memory cell transistor. Therefore, a test is required on the sub-memory cell array basis, which causes a problem of significant increase in a test time period and a test cost.

SUMMARY OF THE INVENTION

Therefore, an object of the present invention is to provide a semiconductor memory device which realizes reduction in the test time period by performing the disturb refresh test in a hierarchical bit line structure on the basis of the memory cell array including a main bit line.

The present invention is directed to a semiconductor memory device having a plurality of memory cell arrays each of which composes a group of memory cells and a sense amplifier circuit. To attain the above-described object, in the semiconductor memory device of the present invention, each of the plurality of memory cell arrays includes: a plurality of sub-memory cell arrays; sub-bit lines respectively allocated in each of the plurality of sub-memory cell arrays, and connected to the group of memory cells; a main bit line allocated in said each of the plurality of memory cell arrays and connected to the sub-bit lines via selection switches and also connected to the sense amplifier circuit; and means for activating, in accordance with a test mode signal externally inputted, each of the selection switches allocated in said each of the plurality of memory cell arrays.

Alternatively, to attain the above-described object, in the semiconductor memory device of the present invention, each of the plurality of memory cell arrays includes: a plurality of sub-memory cell arrays; sub-bit lines respectively allocated in each of the plurality of sub-memory cell arrays, and connected to the group of memory cells; a main bit line allocated in said each of the plurality of memory cell arrays and connected to the sub-bit lines via selection switches and also connected to the sense amplifier circuit; means for, among the selection switches in the plurality of sub-memory cell arrays allocated in a memory cell array selected from among the plurality of memory cell arrays, activating a selection switch in a selected sub-memory cell array which includes a selected word line, and deactivating selection switches in non-selected sub-memory cell arrays each of which does not include the selected word line, in accordance with a test mode signal, an address signal, and an operation activation signal which are externally inputted; and means for re-activating the selection switches in the non-selected sub-memory cell arrays allocated in the selected memory cell array after deactivation thereof.

Here, it is preferable that the selection switches in the non-selected sub-memory cell arrays in the selected memory cell array become non-activated at a timing before the selected word line become activated.

Further, it is preferable that the selection switches in the non-selected sub-memory cell arrays in the selected memory cell array change from a non-activated state to an activated state at a timing after the selected word line becomes activated and also after the sense amplifier circuit becomes activated.

According to the present invention, it is possible to perform the disturb refresh test in the hierarchical bit line structure on the basis of the memory cell array including a main bit line, thereby enabling reduction in the test time period. According to the present invention, the number of the sub-bit lines connected to the main bit line is reduced at the time of the test mode operation so as to reduce the load capacity of the bit lines, and thus it is possible to increase the read-out electric potential from the memory cell connected to the selected word line, and the data of the memory cell connected to the selected word line will not be broken.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
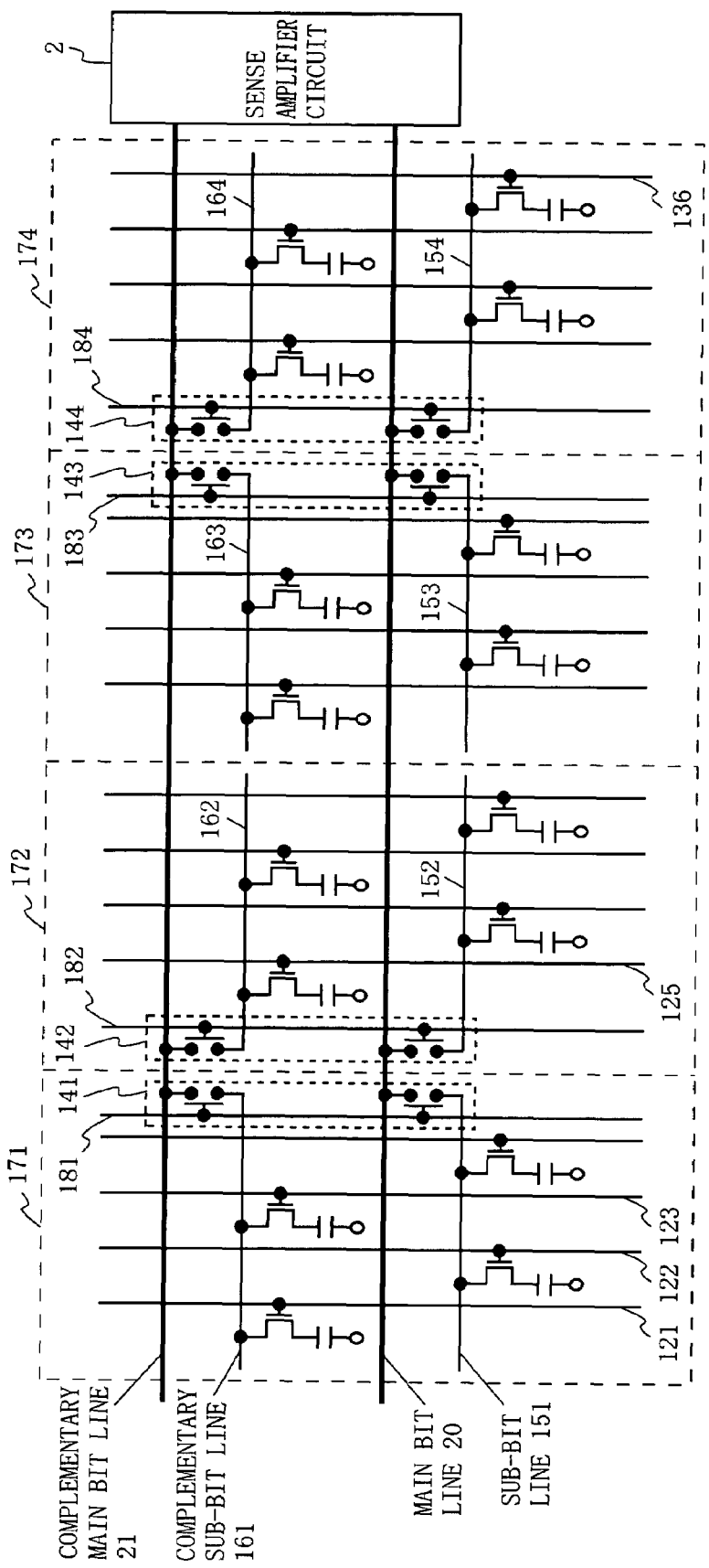
FIG. 1 is a diagram showing a general configuration of a semiconductor memory device including a memory cell section having a hierarchical bit line structure.

Hereinafter, with reference to drawings, an embodiment of the present invention will be described. FIG. 1 is a diagram showing a general configuration of a semiconductor memory device including a memory cell section having a hierarchical bit line structure according to one embodiment of the present invention. In FIG. 1, the semiconductor memory device of the present invention includes a plurality of sub-memory cell arrays 171 to 174 (in this example, four sub-memory cell arrays) each of which has a unit of sub-bit lines, and a sense amplifier circuit 2. The sub-memory cell arrays 171 to 174 respectively include a plurality of memory cell transistors for accumulating an electric charge and sub-bit line selection switches 141 to 144.

a main bit line 20 and a complimentary main bit line 21 are connected to the sense amplifier circuit 2. The main bit line 20 and the complimentary main bit line 21 are electrically connected to sub-bit lines 151 to 154 and complimentary sub-bit lines 161 to 164 via sub-bit line selection switches 141 to 144, respectively. The sub-bit line selection switches 141 to 144 are controlled by sub-bit line selection switch control signals 181 to 184.

Figure 2:
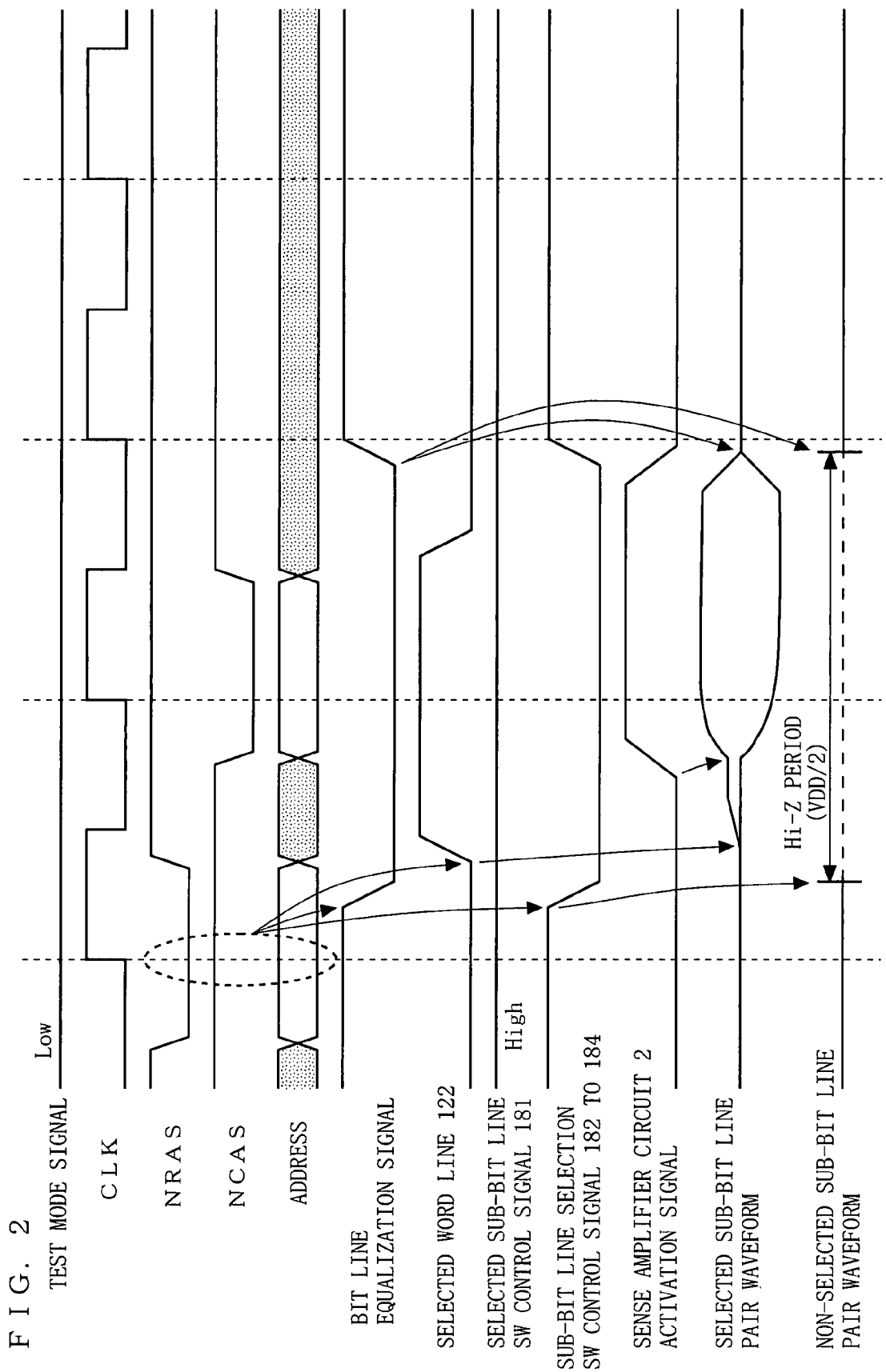
FIG. 2 is a diagram showing a timing chart of respective signals and commands at the time of a normal mode operation.
Figure 3:
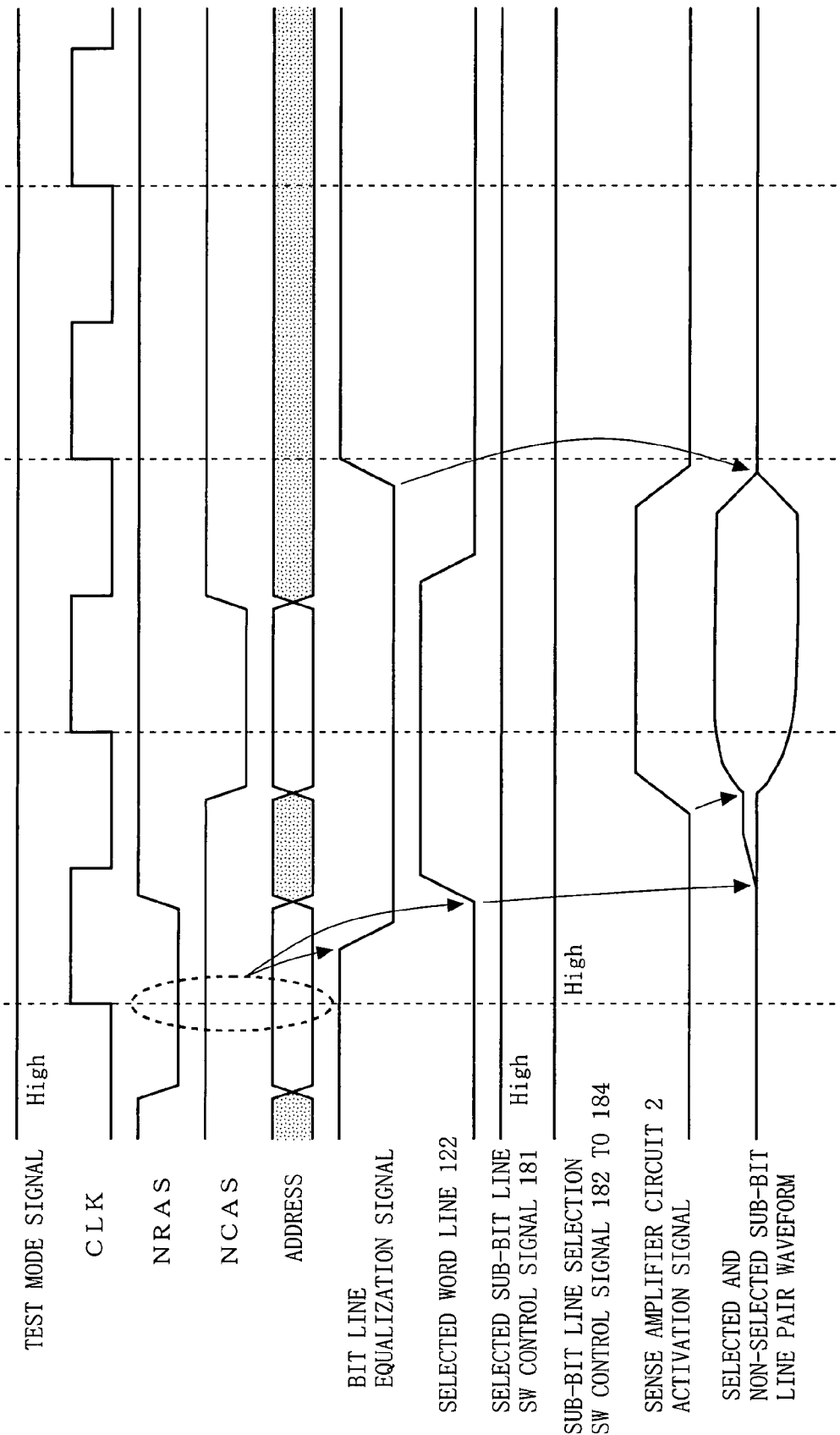
FIG. 3 is a diagram showing a timing chart of respective signals and commands at the time of a test mode [1] operation.
Figure 4:
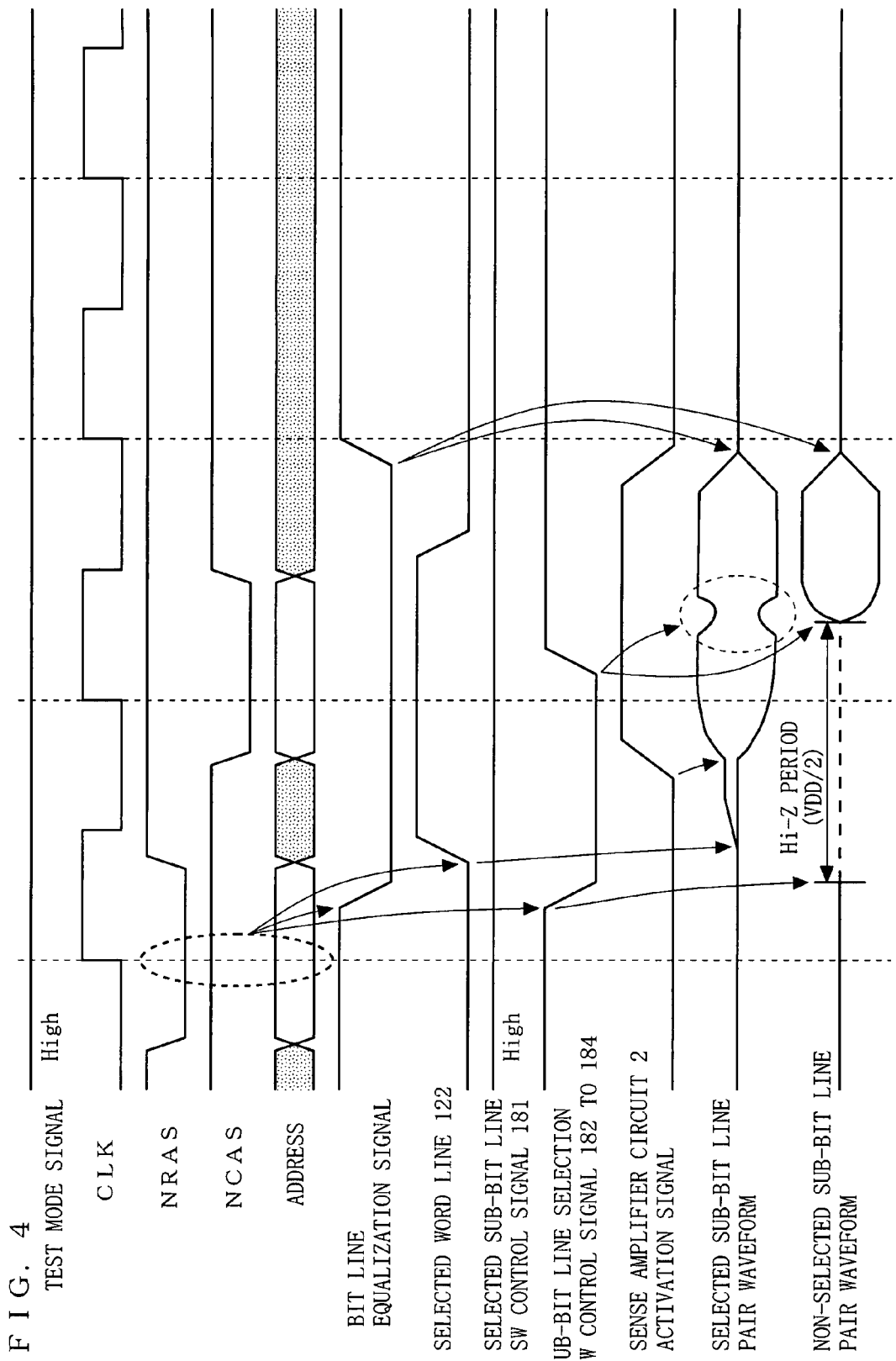
FIG. 4 is a diagram showing a timing chart of respective signals and commands at the time of a test mode [2] operation.

The semiconductor memory device of the present invention performs, based on the above-described structure, a normal mode operation and test mode operations (two types) as described below. FIG. 2 is a diagram showing a timing chart of respective signals and commands at the time of the normal mode operation. FIG. 3 is a diagram showing a timing chart of respective signals and commands at the time of a test mode [1] operation. FIG. 4 is a diagram showing a timing chart of respective signals and commands at the time of a test mode [2] operation.

First, with reference to FIG. 2, the normal mode operation, in which the test mode is not set, will be described. At the time of the normal mode operation, a test mode signal is set at a Low level. When a memory operation is on standby, if all the sub-bit line selection switches 141 to 144 are in an activation state, and a pre-charge level is at a VDD/2 level, the main bit line 20 and the sub-bit lines 151 to 154 are also at the VDD/2 level.

An internal operation is started in a next cycle by an external input command of NRAS and an address signal. With this operation, a sub-memory cell array including a selected word line performs a different operation from the remaining sub-memory cell arrays even in an activated memory cell array. Here, in the case where a word line 122 is selected, the sub-memory cell array 171 will be selected, and the remaining sub-memory cell arrays 172 to 174 will be non-selected sub-memory cell arrays. A bit line equalizing circuit (not shown) included in the sense amplifier circuit 2 causes the sub-bit line selection switches 142 to 144 in the non-selected sub-memory cell arrays 172 to 174 to be in a non-activated state, at the same timing as the non-selected state.

Accordingly, non-selected sub-bit lines 152 to 154 and non-selected complimentary sub-bit lines 162 to 164 can be separated from the main bit line 20 and the complimentary main bit line 21, and thus it is possible to reduce a total load capacity of the bit lines. Accordingly, it becomes possible to increase a read-out electric potential from the memory cell. Further, the selected word line 122 is activated, whereby data is read out from the memory cell on the selection sub-bit line 151, which is kept connected to the main bit line 20, and then amplified at the sense amplifier circuit 2. During this time period, each of the non-selected sub-bit lines 152 to 154 is electrically separated, and thus in a high impedance state (Hi-z). After the selected sub-bit line 151 is sufficiently amplified, the word line 122 is caused to be in a non-activated state, and then equalizing of the bit lines is started and sub-bit line selection switches 142 to 144 in the non-selected sub-memory cell arrays 172 to 174 are returned to the activated state.

Next, with reference to FIG. 3, the test mode [1] operation, in which a first test mode is set, will be described. The test mode [1] operation is different from the normal mode operation (FIG. 2) in that a test mode signal is set at a High level and that the sub-bit line selection switches 142 to 144 in non-selected sub-memory cell arrays 172 to 174 remain to be in the activated state.

At the time of the normal mode operation, when the internal operation is started, the sub-bit line selection switches 142 to 144 in the non-selected sub-memory cell arrays 172 to 174 are controlled to be in the non-activated state. On the other hand, at the time of the test mode [1] operation, the sub-bit line selection switches 142 to 144 in the non-selected sub-memory cell arrays 172 to 174 remain to be in the activated state. Therefore, read-out of the data from the memory cell and amplification in the sense amplifier circuit 2 are performed in a state where all the sub-bit lines 151 to 154 are connected to the main bit line 20 via the sub-bit line selection switches 141 to 144.

Therefore, in the normal mode operation, the sufficient electric potential difference is not provided between the source and the drain of each of the memory cell transistors of the non-selected sub-memory cell arrays, and there has been a problem of a increased disturb refresh test time since the disturb refresh test cannot be performed to the memory cell. However, according to the present invention, with the use of the above-described test mode [1] operation, non-selected sub-bit lines are also oscillated to the High level or the Low level, and thus it is possible to perform a test on the memory cell array basis, and consequently to reduce the test time period.

Next, with reference to FIG. 4, the test mode [2] operation, in which a second test mode is set, will be described. The internal operation is started by the external input command of the NRAS and the address signal. With this operation, as with the normal mode operation, a different control is performed between the sub-memory cell array including the selected word line and the remaining sub-memory cell arrays even in an activated memory cell array. Here, in the case where a word line 122 is selected by the external input address, the sub-memory cell array 171 will be selected, and the remaining sub-memory cell arrays 172 to 174 will be non-selected sub-memory cell arrays. The sub-bit line selection switch control signals 182 to 184 in the non-selected sub-memory cell arrays 172 to 174 causes the sub-bit line selection switches 142 to 144 to be in a non-activated state in accordance with a start of the internal operation. A control of connecting only the selected sub-bit line 151 to the main bit line 20 is performed in the same manner as the normal mode.

The read-out of the data from the memory cell on the selected sub-bit line 151 and the amplification by the sense amplifier circuit 2 are then performed. Here, after the selected sub-bit line 151 and the main bit line 20 are sufficiently amplified, the sub-bit line selection switches 142 to 144 are again caused to be activated. Accordingly, the amplitudes of the selected sub-bit line 151 and the main bit line 20 temporarily decreases in both of a High level side and a Low level side, but data will not be broken because the sense amplifier circuit 2 is in a activated state, and also because the amplitude of the bit line has been sufficiently amplified.

Accordingly, in the test mode [2] operation, as with the test mode [1] operation, the non-selected sub-bit lines also oscillate to the High level or the Low level, whereby it is possible to perform a test on the memory cell array basis, and to reduce the test time period. Further, in the test mode [1] operation, since the non-selected sub-bit lines are connected when the data of the memory cell is read out on the selected sub-bit line, a total load capacity of the bit lines will increase compared to the time of the normal mode operation, and it is also highly likely to cause erroneous read-out of the data. On the other hand, in the test mode [2] operation, when the data is readout, it is possible to prevent an increase in the load capacity of the bit lines at the same timing as the normal operation and to perform the disturb refresh test for the non-selected bit lines.

As above described, according to the semiconductor memory device based on the one embodiment of the present invention including memory cell sections each of which has the hierarchical bit line structure, it is possible to perform the disturb refresh test in the hierarchical bit line structure on the basis of the memory cell array including the main bit lines, thereby enabling reduction of the test time period. Further, according to the present invention, the number of the sub-bit lines connected to the main bit line is reduced at the time of the test mode operation so as to reduce the loads of the bit lines, and thus it is possible to increase the read-out electric potential from the memory cell connected the selected word line, and the data of the memory cell connected to the selected word line will not be broken.

While the invention has been described in detail, the foregoing description is in all aspects illustrative and not restrictive. It is understood that numerous other modifications and variations can be devised without departing from the scope of the invention.

What is claimed is:

1. A semiconductor memory device having a plurality of memory cell arrays each of which composes a group of memory cells and a sense amplifier circuit, wherein
   each of the plurality of memory cell arrays includes:
   a plurality of sub-memory cell arrays;
   sub-bit lines respectively allocated in each of the plurality of sub-memory cell arrays, and connected to the group of memory cells;
   a main bit line allocated in said each of the plurality of memory cell arrays and connected to the sub-bit lines via selection switches and also connected to the sense amplifier circuit; and
   means for activating, in accordance with a test mode signal externally inputted, each of the selection switches allocated in said each of the plurality of memory cell arrays.

2. A semiconductor memory device having a plurality of memory cell arrays each of which composes a group of memory cells and a sense amplifier circuit, wherein
   each of the plurality of memory cell arrays includes:
   a plurality of sub-memory cell arrays;
   sub-bit lines respectively allocated in each of the plurality of sub-memory cell arrays, and connected to the group of memory cells;
   a main bit line allocated in said each of the plurality of memory cell arrays and connected to the sub-bit lines via selection switches and also connected to the sense amplifier circuit;
   means for, among the selection switches in the plurality of sub-memory cell arrays allocated in a memory cell array selected from among the plurality of memory cell arrays, activating a selection switch in a selected sub-memory cell array which includes a selected word line, and deactivating selection switches in non-selected sub-memory cell arrays each of which does not include the selected word line, in accordance with a test mode signal, an address signal, and an operation activation signal which are externally inputted; and
   means for re-activating the selection switches in the non-selected sub-memory cell arrays allocated in the selected memory cell array after deactivation thereof.

3. The semiconductor memory device according to claim 2, wherein the selection switches in the non-selected sub-memory cell arrays in the selected memory cell array become non-activated at a timing before the selected word line become activated.

4. The semiconductor memory device according to claim 2, wherein the selection switches in the non-selected sub-memory cell arrays in the selected memory cell array change from a non-activated state to an activated state at a timing after the selected word line becomes activated and also after the sense amplifier circuit becomes activated.

* * * * *